United States Patent
Lee et al.

(10) Patent No.: US 9,960,201 B2
(45) Date of Patent: May 1, 2018

(54) IMAGE SENSOR AND PIXEL OF THE IMAGE SENSOR

(71) Applicant: SAMSUNG ELECTRONICS CO., LTD., Suwon-si, Gyeonggi-Do (KR)

(72) Inventors: Kyung Ho Lee, Suwon-si (KR); Seung Joo Nah, Gwangju (KR); Young Sun Oh, Yongin-si (KR); Dong Young Jang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 14/830,926

(22) Filed: Aug. 20, 2015

(65) Prior Publication Data

US 2016/0064446 A1    Mar. 3, 2016

(30) Foreign Application Priority Data

Aug. 28, 2014  (KR) .................. 10-2014-0113463

(51) Int. Cl.
*H01L 31/062* (2012.01)
*H01L 31/113* (2006.01)
*H01L 27/146* (2006.01)

(52) U.S. Cl.
CPC .... *H01L 27/14643* (2013.01); *H01L 27/1461* (2013.01); *H01L 27/1463* (2013.01); *H01L 27/14603* (2013.01); *H01L 27/14614* (2013.01); *H01L 27/14616* (2013.01); *H01L 27/14641* (2013.01); *H01L 27/14689* (2013.01)

(58) Field of Classification Search
CPC ........... H01L 27/14689; H01L 27/1463; H01L 27/14643; H01L 27/14609; H01L 27/14603; H01L 27/14641; H01L 27/14616; H01L 27/1461; H01L 27/14614
USPC ......... 257/292, 291, 431, E27.133, E27.132, 257/E27.152
See application file for complete search history.

(56) References Cited

U.S. PATENT DOCUMENTS

| | | | |
|---|---|---|---|
| 7,936,036 B2 | 5/2011 | Tanaka et al. | |
| 2002/0179997 A1* | 12/2002 | Goth | ................ H01L 21/76237 257/514 |
| 2005/0139878 A1 | 6/2005 | Han et al. | |
| 2006/0071294 A1* | 4/2006 | Lowis | ............... H01L 21/76237 257/510 |
| 2008/0210992 A1 | 9/2008 | Kim | |
| 2009/0166516 A1* | 7/2009 | Tamura | ............. H01L 27/14603 250/214.1 |
| 2010/0227429 A1 | 9/2010 | Kim et al. | |
| 2011/0140229 A1 | 6/2011 | Rachmady et al. | |
| 2013/0001661 A1 | 1/2013 | Mao et al. | |
| 2013/0082312 A1 | 4/2013 | Hung et al. | |
| 2013/0113969 A1 | 5/2013 | Manabe et al. | |
| 2014/0103412 A1 | 4/2014 | Lee et al. | |
| 2014/0226046 A1* | 8/2014 | Lahav | .................... H04N 5/353 348/296 |

* cited by examiner

*Primary Examiner* — Thien F Tran
(74) *Attorney, Agent, or Firm* — Volentine & Whitt, PLLC

(57) ABSTRACT

A pixel of an image sensor includes a well below a gate and containing a dopant at a first concentration, a shallow trench isolation (STI) configured to electrically isolate the well, and a channel stop adjacent to at least one border between the well and the STI and containing a dopant at a second concentration higher than the first concentration.

9 Claims, 20 Drawing Sheets

IMAGE SENSOR AND PIXEL OF THE IMAGE SENSOR

PRIORITY STATEMENT

This application claims priority under 35 U.S.C. § 119(a) from Korean Patent Application No. 10-2014-0113463 filed on Aug. 28, 2014, the disclosure of which is hereby incorporated by reference in its entirety.

BACKGROUND

Embodiments of the inventive concept are drawn to an image sensor and to a pixel of the image sensor. More particularly, embodiments of the inventive concept are drawn to complementary metal oxide semiconductor (CMOS) images sensors and pixels of CMOS image sensors.

Digital images may be produced using complementary metal oxide semiconductor (CMOS) image sensors or charge coupled device (CCD) image sensors. Complementary metal oxide semiconductor (CMOS) image sensors are solid state image sensing devices that use a combination of p-type and n-type metal oxide semiconductor field effect transistors. Charge coupled device (CCD) image sensors include a high-voltage analog circuit. CMOS image sensors have lower manufacturing costs and are smaller than CCD image sensors and thus are advantageous in terms of power consumption, i.e., consume less power in general than CCD images sensors. In addition, CMOS image sensors offer far greater performance than they did during their early stages of development. Therefore, CMOS image sensors are the preferred choice for use in various electronic products that produce digital images including portable devices such as smart phones and digital cameras.

A pixel array of a CMOS image sensor includes a photoelectric conversion element in each pixel. The photoelectric conversion element generates an electrical signal varying with the quantity of incident light and the CMOS image sensor processes electrical signals to synthesize an image. There is on ongoing demand for electronic products that are more compact and yet which can produce high-resolution images. To meet this demand, the pixels of a CMOS image sensor must be miniaturized.

A trench isolation process, namely, a process which includes the forming of a trench in a substrate, is usually used to isolate elements in a miniaturized pixel. However, a pixel formed using a typical trench isolation process may allow for various types of noise to be produced, due to characteristics imparted to the pixel as a result of the trench isolation process.

SUMMARY

According to one aspect of the inventive concept, there is provided a pixel of an image sensor which includes a well containing dopant at a first concentration, a gate of a transistor disposed on the well, shallow trench isolation (STI) electrically isolating the well, whereby the STI has sides defining first and second borders, respectively, of a region of the pixel comprising the well and though which a channel of the transistor is formed, the first and second borders being spaced in the widthwise direction of the channel, and a channel stop adjacent at least one of the first and second borders and containing dopant at a second concentration higher than the first concentration.

According to another aspect of the inventive concept, there is provided an image sensor including a pixel array comprising a plurality of pixels each configured to output a pixel signal corresponding to incident light, a readout circuit configured to perform analog-to-digital conversion on the pixel signal and to generate a digital pixel signal, and a timing generator configured to control the pixel array and the readout circuit, and in which each of the pixels comprises a well containing dopant at a first concentration, a gate of a transistor disposed on the well, shallow trench isolation (STI) electrically isolating the well, whereby the STI has sides defining first and second borders, respectively, of a region of the pixel comprising the well and though which a channel of the transistor is formed, the first and second borders being spaced in the widthwise direction of the channel, and a channel stop adjacent at least one of the first and second borders and containing dopant at a second concentration higher than the first concentration.

According to still another aspect of the inventive concept, there is provided a pixel of an image sensor, which includes a photo diode configured to accumulate photocharges generated according to the intensity of incident light, a well beneath a gate of a supplementary transistor connected to a floating diffusion region to which the photocharges are transferred and which well contains dopant at a first concentration, STI electrically isolating the well, and a channel stop adjacent to at least one border between the well and the STI and containing dopant at a second concentration higher than the first concentration.

According to still another aspect of the inventive concept, there is provided a pixel array comprising a substrate having an isolation layer dividing the substrate into a plurality of active areas each corresponding to a pixel of the array, a well in each of the active areas of the substrate and which includes a source and a drain region of a transistor, and a channel region between the source and drain region and in which a channel of the transistor is formed, shallow trench isolation (STI) isolating the well in each of the active areas, a respective gate disposed on each channel region, and a respective channel stop extending beneath each respective gate, and in which the channel region contains dopant at a first concentration, and in which in each of the pixels, the channel stop is interposed between at least part of a the channel region and the STI, the STI has first and second sides facing each other on opposite sides of the channel region, the channel stop is disposed against at least one of said sides of the STI, and the channel stop contains dopant at a second concentration higher than the first concentration.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF THE PREFERRED EMBODIMENTS

Figure 1:
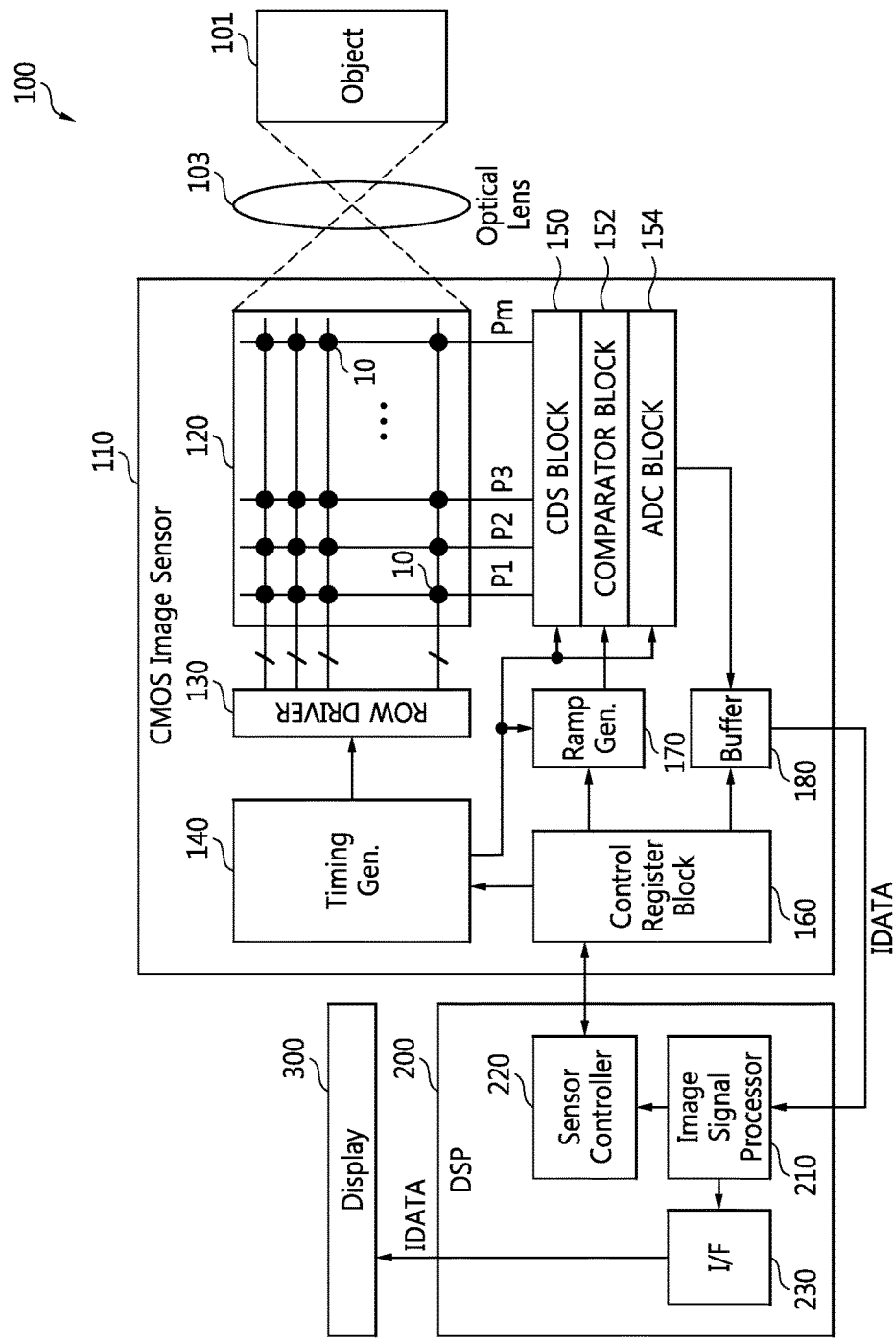
FIG. 1 is a block diagram of an embodiments of an image processing system according to the inventive concept.

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. For example, the term "dopant" will be understood to refer to impurities introduced into the intrinsic material of the element or layer in question. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an image processing system 100 according to the inventive concept. The image processing system 100 may be that of a portable electronic device such as a laptop computer, a cellular phone, a smart phone, a tablet personal computer (PC), a personal digital assistant (PDA), an enterprise digital assistant (EDA), a digital still camera, a digital video camera, a portable multimedia player (PMP), a mobile internet device (MID), a wearable computer, an internet of things (IoT) device, or an internet of everything (IoE) device.

The image processing system 100 includes an optical lens 103, a complementary metal-oxide-semiconductor (CMOS) image sensor 110, a digital signal processor (DSP) 200, and a display 300. Each of the components 110 and 200 may be embodied as a chip.

The CMOS image sensor 110 may generate a digital pixel signal DPS corresponding to an image of an object input (or captured) through the optical lens 103. The CMOS image sensor 110 includes a pixel (or active pixel sensor (APS)) array 120, a row driver 130, a timing generator 140, a correlated double sampling (CDS) block 150, a comparator block 152, an analog-to-digital conversion (ADC) block 154, a control register block 160, a ramp generator 170, and a buffer 180.

The pixel array 120 includes a plurality of pixels 10 arranged in a matrix. The structures and operations of the pixel array 120 and the pixels 10 will be described later in more detail with reference to FIGS. 2 through 18. Each of the pixels 10 may be referred to as a unit pixel considering that the pixels 10 form one pixel array 120.

The row driver 130 may transmit a plurality of control signals to the pixel array 120 for controlling the operation of the pixels 10 under the control of the timing generator 140. The control signals will be described later in more detail with reference to FIGS. 16 and 18.

The timing generator 140 may control the operations of the row driver 130, the CDS block 150, the ADC block 154, and the ramp generator 170 under the control of the control register block 160.

The CDS block 150 performs CDS on pixel signals P1 through Pm (where "m" is a natural number) output from respective columns of pixels of the pixel array 120. The comparator block 152 compares pixel signals (e.g., voltage levels) that have been subjected to CDS in the CDS block 150 with a ramp signal output from the ramp generator 170 and outputs comparison signals according to the result of the comparison. The ADC block 154 converts the comparison signals received from the comparator block 152 into digital signals and outputs the digital signals to the buffer 180. The CDS block 150, the comparator block 152, and the ADC block 154 may form a readout circuit.

The control register block 160 controls the operations of the timing generator 140, the ramp generator 170, and the buffer 180 under the control of the DSP 200. The buffer 180 transmits digital pixel signals DPS respectively corresponding to the digital signals output from the ADC block 154 to the DSP 200. The DSP 200 includes an image signal processor 210, a sensor controller 220, and an interface 230.

The image signal processor 210 controls the interface 210 and the sensor controller 220 which controls the control register block 160. The image sensor 110 and the DSP 200 may be respectively embodied as chips in a single package, e.g., a multi-chip package. Alternatively, the image sensor 110 and the image signal processor 210 may be respectively embodied as chips in a single package, e.g., a multi-chip package. As another alternative, the image sensor 110 and the image signal processor 210 may be integrated in a single chip.

The image signal processor 210 processes the digital pixel signals DPS received from the buffer 180 and transmits processed image data IDATA to the interface 230. The sensor controller 220 generates various control signals for controlling the control register block 160 under the control of the image signal processor 210. The interface 230 transmits the processed image data IDATA from the image signal processor 210 to the display 300.

The display 300 displays the image data IDATA output from the interface 230. The display 300 may be a thin film transistor-liquid crystal display (TFT-LCD), a light emitting diode (LED) display, an organic LED (OLED) display, or an active-matrix OLED (AMOLED) display.

Various embodiment and examples of pixels that may constitute the pixels 10 of the pixel array 120 will now be described with reference to FIGS. 2-14. These embodiments are similar except as otherwise described. Therefore, in some instances and respects detailed descriptions of similarities between these embodiments of FIGS. 2 through 14 are omitted to avoid redundancy.

Figure 2:
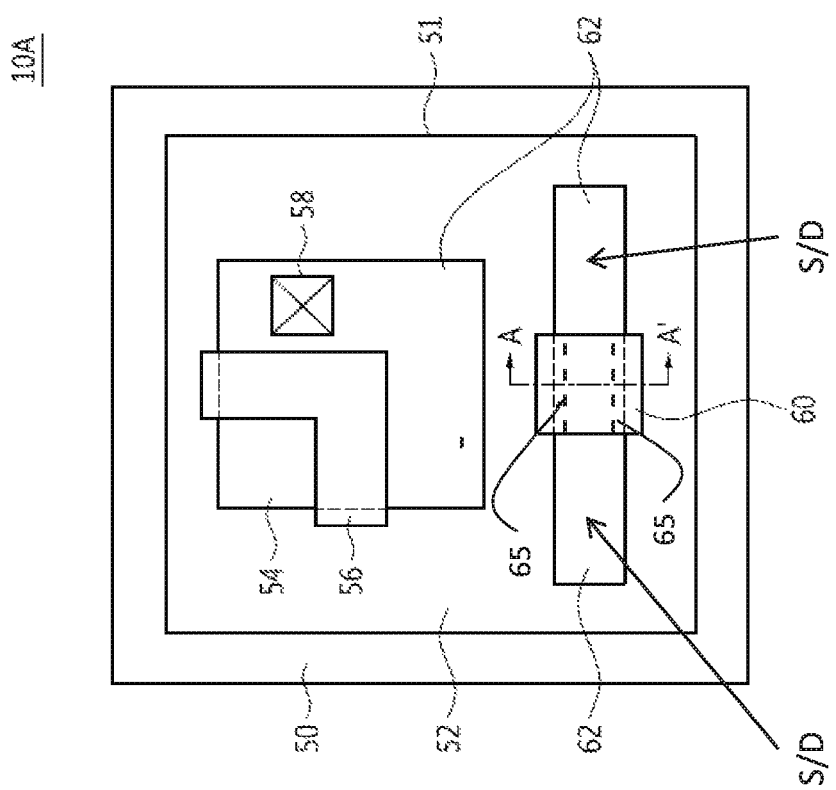
FIG. 2 is a diagram of a layout of an embodiment of a pixel of a pixel array of the system illustrated in FIG. 1 according to the inventive concept.

FIG. 2 is a diagram of a layout 10A of certain elements of embodiments of a pixel 10A of the pixel array 120 illustrated in FIG. 1 according to the inventive concept. That is, the pixel layout 10A shows the arrangement of elements in a deep trench isolation (DTI) area 50 and an active area 51 of each pixel 10 of the array 120 illustrated in FIG. 1.

Referring to FIGS. 1 and 2, the DTI area 50 may be formed at the edge of the active area 51 for electrical or optical isolation from an active area (not shown) of another adjacent pixel (not shown). The DTI area 50, as the name implies, is formed using a DTI process in which a deep trench is formed in a substrate and filled with isolation material. In examples of this embodiment, the isolation material comprises an oxide, such as hafnium oxide, and/or polysilicon.

The DTI area 50 is composed to prevent crosstalk which would otherwise cause a decrease in signal-to-noise ratio (SNR) due to an exchange of carriers between active regions. To this end, for example, sides of the DTI area 50 are doped with a material having high light reflectance, thereby preventing optical crosstalk that would otherwise occur if light incident on the active area 51 were to be transmitted into an adjacent active area (not shown). The sides of the DTI area 50 may be formed of a polysilicon film doped with boron having high reflectance, but the inventive concept is not restricted to this example.

The active area 51 may include shallow trench isolation (STI) 52, a floating diffusion region 54, a transfer transistor gate 56, a ground 58, a supplementary transistor gate 60, and a well 62. The elements included of the active area 51 and their arrangement are exemplary only and the inventive concept is not restricted to the example of the active area 51 illustrated in FIG. 2.

The STI 52 may extend around each element (e.g., the well 62) in the DTI area 50. The STI 52, as the name also implies, is formed using an STI process to electrically isolate the elements. The STI 52 is shallower than the DTI area 50. However, the STI 52 may be formed of substantially the same material as the DTI area 50.

The floating diffusion region 54 may be adjacent the transfer transistor gate 56. The STI 52 may be interposed between the DTI area 50 and the floating diffusion 54, as shown in FIG. 2. In other embodiments, the floating diffusion region 54 borders the DTI area 50. The floating diffusion region 54 is a node at which photocharges accumulate. The photocharges are produced by a photo diode (e.g., PD1 or PD2 in FIG. 16) and are transferred to the floating diffusion region 54 by a transfer transistor (e.g., TX1 or TX2 in FIG. 16).

The transfer transistor gate 56 may receive a transfer control signal TG1, TG2, TG3, or TG4, which will be described later in more detail with reference to FIGS. 16 through 18. The transfer transistor gate 56 may be formed of polysilicon.

The ground 58 provides a ground voltage necessary for the operation of the pixel 10. For instance, the ground 58 may apply the ground voltage to an end of a photo diode (e.g., PD1 or PD2 in FIG. 16).

The supplementary transistor gate 60 may receive a control signal (e.g., RG in FIG. 16) or may be connected to the floating diffusion region 54. The supplementary transistor may be a reset transistor, a driver transistor, or a select transistor.

The well 62 is doped with p- or n-type impurities. It electrically isolates elements (e.g., a supplementary transistor and a photo diode) from each other. A region highly doped with impurities (e.g., p++ or n++ impurities) may be formed in the well 62. This highly doped region may function as a source terminal and/or drain terminal of the supplementary transistor. More specifically, the highly doped region may be formed in a line in the well 62 on the right and left sides of the supplementary transistor gate 60 to function as the source terminal and/or the drain terminal (i.e. source and drain (S/D) regions) of the supplementary transistor. S/D regions are indicated in an example of the embodiment of FIG. 2 and may be similarly be provided in other examples (e.g., of the embodiments of FIGS. 6 and 8) that follow.

In the illustrated example of this embodiment, the pixel array 120 is highly integrated, i.e., has a high integration density, because each pixel of the array has only two transistors, namely, the transfer transistor and the supplementary transistor.

Figure 3:
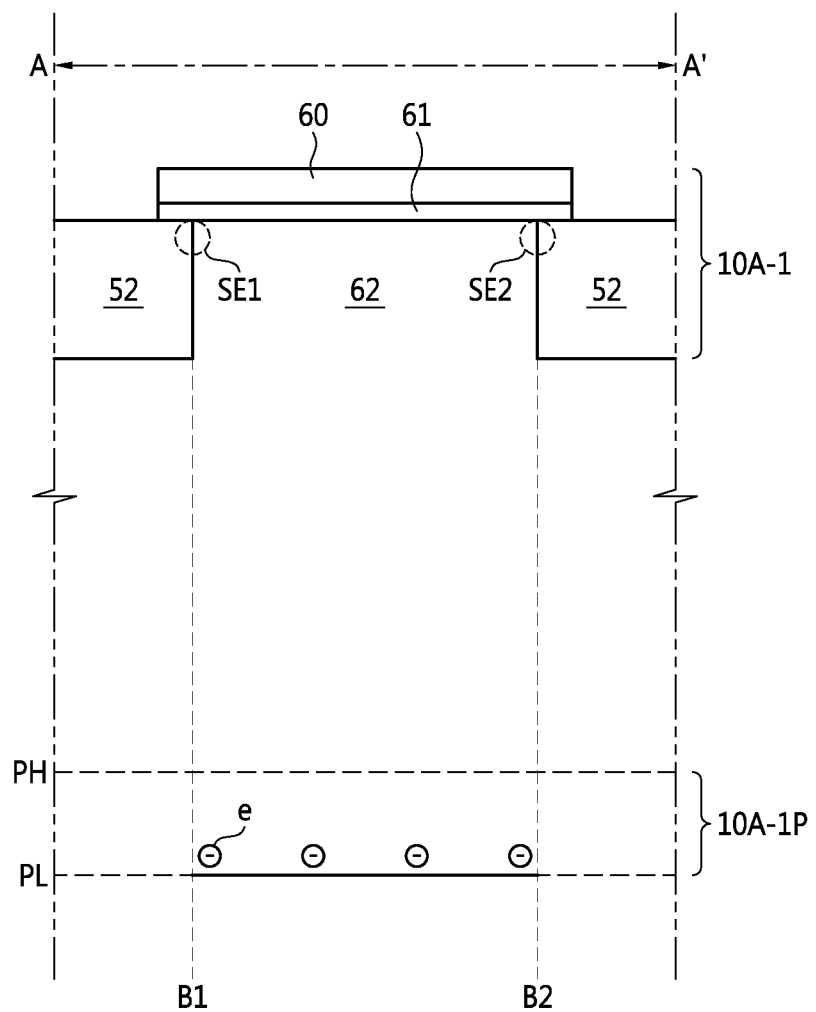
FIG. 3 is a cross-sectional view of a structure of an example of a pixel, take in a direction along a line corresponding to line A-A' in FIG. 2, and a diagram of corresponding potential distribution of the pixel, for use in comparison with examples of pixels according to the inventive concept.
Figure 4:
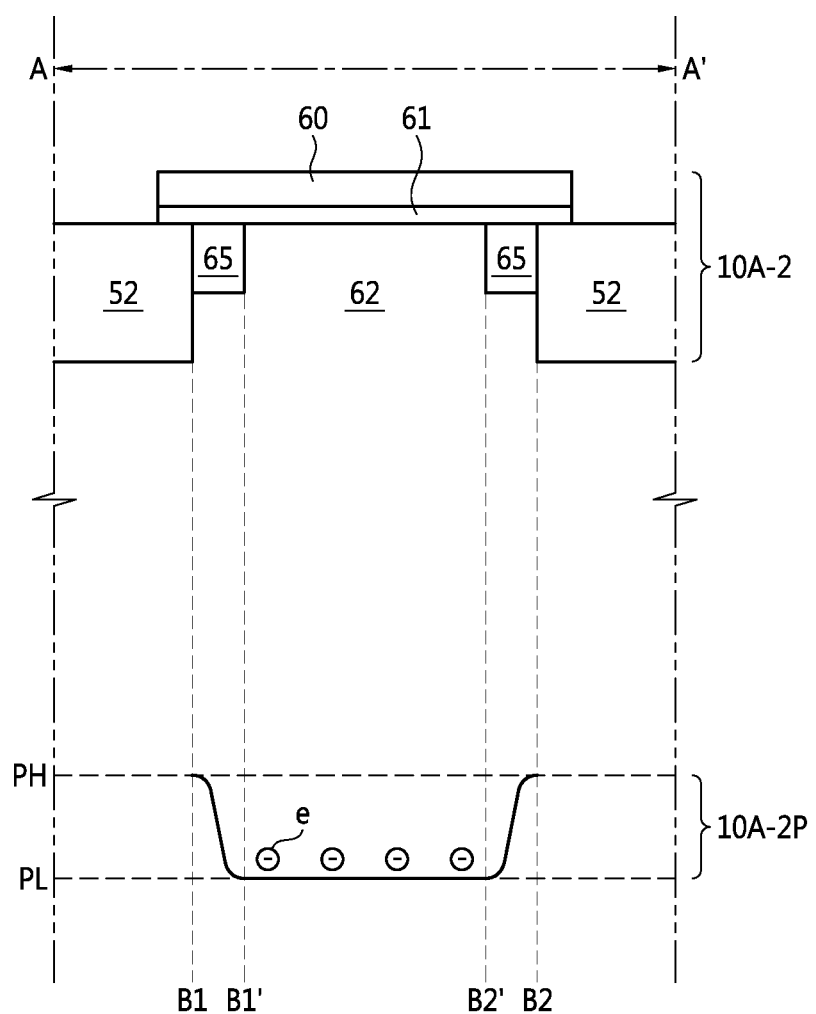
FIG. 4 is a cross-sectional view of a structure of an example of the embodiment of the pixel of FIG. 2, take along line A-A' in FIG. 2, and a diagram of corresponding potential distribution of the pixel, according to the inventive concept.
Figure 5:
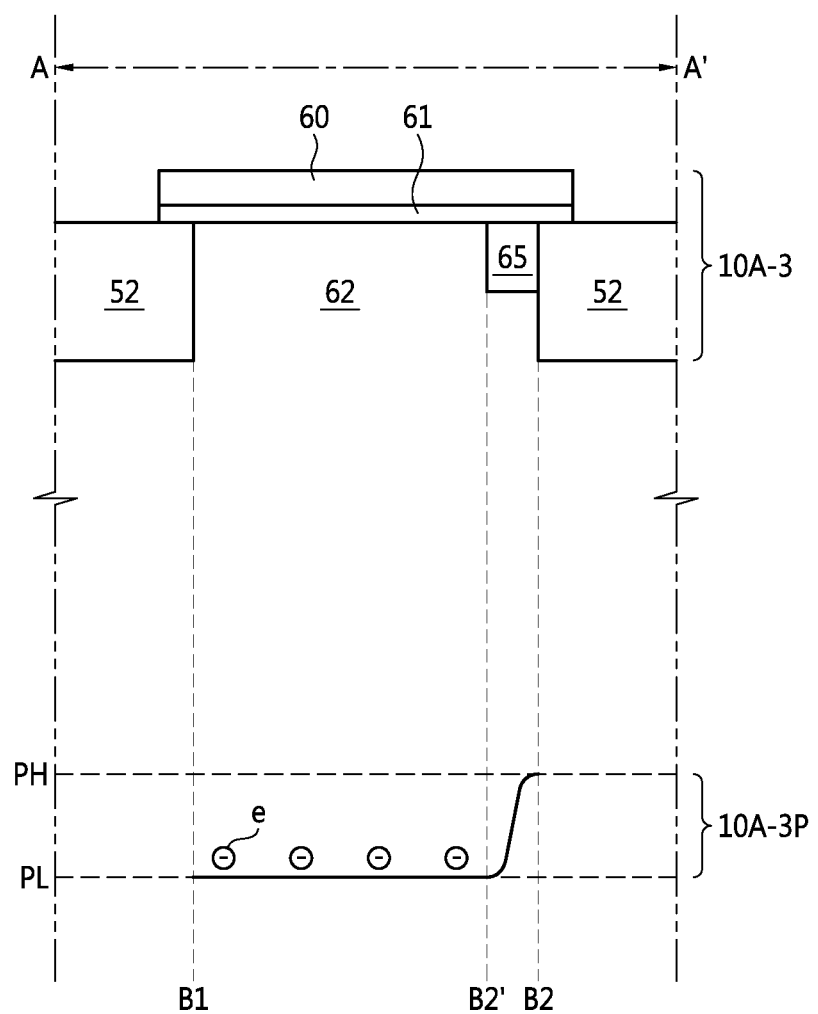
FIG. 5 is a cross-sectional view of a structure of another example of the embodiment of the pixel of FIG. 2, take along line A-A' in FIG. 2, and a diagram of corresponding potential distribution of the pixel, according to the inventive concept.

FIG. 3 illustrates a structure 10A-1 including a supplementary transistor of an example of a pixel for comparison with embodiments of pixels according to the inventive concept, as well as a corresponding potential 10A-1P distributed along the structure. FIG. 4 illustrates a structure 10A-2 including a supplementary transistor of an example of the embodiment of a pixel 10A according to the inventive concept, as well as a corresponding potential 10A-2P distributed along the structure. FIG. 5 illustrates a structure 10A-3 including a supplementary transistor of another example of the embodiment of a pixel 10A according to the inventive concept, as well as a corresponding potential 10A-3P distributed along the structure.

Referring to FIG. 3, in addition to STI 52, supplementary transistor gate 60, and well 62 corresponding to those illustrated in FIG. 2, the pixel of the comparative example includes a gate insulator (film) 61. The structure 10A-1 the supplementary transistor may be part of a front side illumination (FSI) or back side illumination (BSI) structure. The structure 10A-1 may also include a photo diode, a wiring layer, a color filter, and a micro lens, but detailed descriptions thereof will be omitted here for the sake of brevity.

The gate insulator film 61 is interposed between the supplementary transistor gate 60 and the well 62. The gate insulator film 61 may be formed of $SiO_2$, SiON, SiN, $Al_2O_3$, $Si_3N_4$, GexOyNz, GexSiyOz, or at least one high-k dielectric material. Examples of high-k dielectric materials are $HfO_2$, $ZrO_2$, $Al_2O_3$, $Ta_2O_5$, hafnium silicate, and zirconium silicate formed by atomic layer deposition.

A channel is formed in the well 62 adjacent to the bottom of the supplementary transistor gate 60 when a given voltage (greater or less than a threshold voltage) is applied to the supplementary transistor gate 60. Charges move from the source to the drain of the supplementary transistor through the channel.

Borders between the STI 52 and the well 62 coincide with a first border B1 and a second border B2 of the well 62. The first and second borders B1 and B2 may be located laterally inwardly with respect to sides of the supplementary transistor gate 60, respectively.

Because the STI 52 is formed using a trench isolation process, a trap effect may occur at STI edges SE1 and SE2 of the borders B1 and B2 at which the STI 52 contacts the well 62. The trap effect is a phenomenon in which charges which are supposed to move through the channel below the supplementary transistor gate 60 are randomly trapped in and de-trapped from the STI edges SE1 and SE2. Charges may be trapped in the STI edges SE1 and SE2 due to the trap effect and the threshold voltage of the supplementary transistor may change due to the trapped charges. A change in the threshold voltage results in a change in a drain current of the supplementary transistor, thereby causing random telegraph noise (RTN) in each of the pixel signals P1 through Pm. The RTN negatively affects image quality and is thus undesirable.

The potential 10A-1P in the figures is that distributed along a region adjacent to the interface between the gate insulator film 61 and the well 62 or the STI 52, that is, a region in which the channel is to be formed. (This applies to the potentials illustrated in FIGS. 4 and 5 described below).

The potential does not exist in the STI 52 because the STI 52 is formed of insulation material. The well 62 is doped between the first and second borders B1 and B2 at a uniform concentration and thus has a uniform potential. The potential may have a value between a high potential PH and a low potential PL. In the case in which charges moving through a channel are electrons "e", as the potential gets close to the low potential PL, the electrons "e" move more easily. FIG. 3 schematically shows the distribution of four moving electrons "e". The electrons "e" move uniformly between the first and second borders B1 and B2 due to the uniform potential. Accordingly, a trap effect occurs at the STI edges SE1 and SE2 respectively adjacent to the first and second borders B1 and B2. As a result, RTN may occur in the pixel signals P1 through Pm.

Referring to FIG. 4, in addition to the STI 52, the supplementary transistor gate 60, and the well 62 illustrated in FIG. 2, structure 10A-2 includes gate insulator (film) 61 and a channel stop 65.

The channel stop 65 may be formed in the well 62 adjacent to the first and second borders B1 and B2 and the gate insulator film 61. In other words, the channel stop 65 may be formed at positions corresponding to the STI edges SE1 and SE2 where a trap effect is likely to occur. The channel stop 65 may be formed using ion implantation. The doping concentration of the channel stop 65 may be higher than that of the well 62. For instance, when the well 62 is doped with p-type impurities, the channel stop 65 may be doped with p+ or p++ impurities.

Also, although FIG. 4 shows the channel stop 65 in section as taken along line A-A' in FIG. 2, as indicated by the chained lines in FIG. 2 the channel stop 65 may extend longitudinally along the entire length of the channel region below the supplementary transistor gate 60, i.e., between the S/D regions.

The width B1-B1' of the channel stop 65 at the first border B1 and the width B2-B2' of the channel stop 65 at the second border B2 may be arbitrarily determined or may be determined through experiments to effectively eliminate a trap effect. Since the channel stop 65 decreases the effective width of the channel and may affect operational characteristics of the supplementary transistor, the width of the channel stop 65 should be determined taking these factors into account.

In any case, the potential 10A-2P distributed along the width of the channel region rapidly increases along the channel stop 65 in a direction approaching the STI 52 from an inner side B1' of the channel stop 65 to the first border B1 and from an inner side B2' of the channel stop 65 to the second border B2. As seen from the distribution of electrons "e" illustrated in FIG. 4, the channel below the supplementary transistor gate 60 is actually formed between the inner sides B1' and B2' of the channel stop 65. In other words, when a channel is formed, the electrons "e" are kept a predetermined distance from the first and second borders B1 and B2, so that a trap effect is suppressed.

Referring to FIG. 5 the channel stop 65 formed in the well 62 is disposed adjacent to only one of the borders (the second border B2 in this example) between the well 62 and the STI 52 lying below the gate insulator film 61.

The potential 10A-3P rapidly increases in the region of the channel stop 65 in a direction approaching the STI 52, i.e., between side B2' of the channel stop and the second border B2. As seen from the distribution of electrons "e" illustrated in FIG. 5, the channel is formed below the supplementary transistor gate 60 between the first border B1 and the distal side B2' of the channel stop 65. Therefore, when a channel is formed, the electrons "e" are kept a predetermined distance from the second border B2, so that a trap effect is suppressed. On the other hand, the channel is maximized to ensure a more satisfactory operational characteristic.

Figure 6:
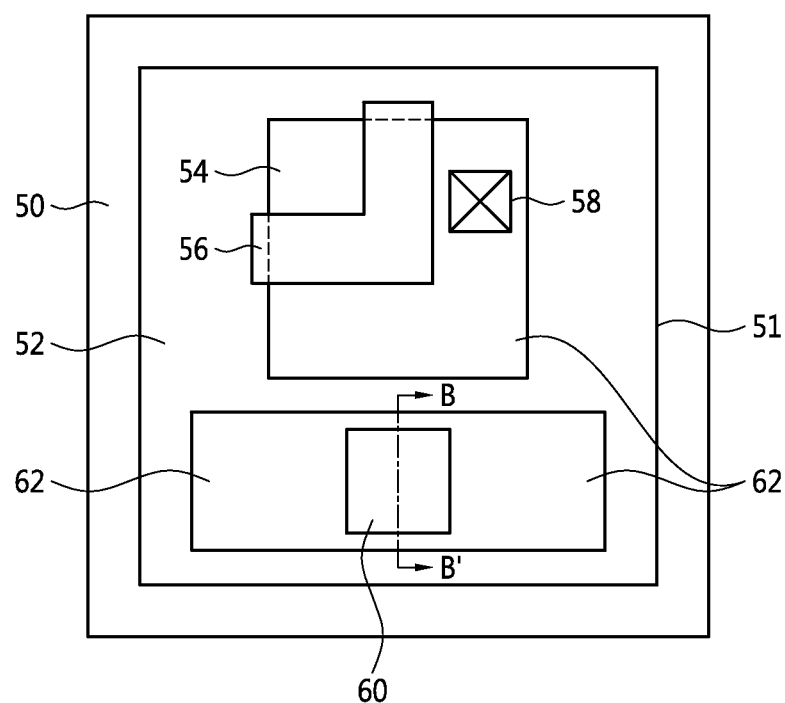
FIG. 6 is a diagram of a layout of another embodiment of a pixel of a pixel array of the system illustrated in FIG. 1 according to the inventive concept.
Figure 7:
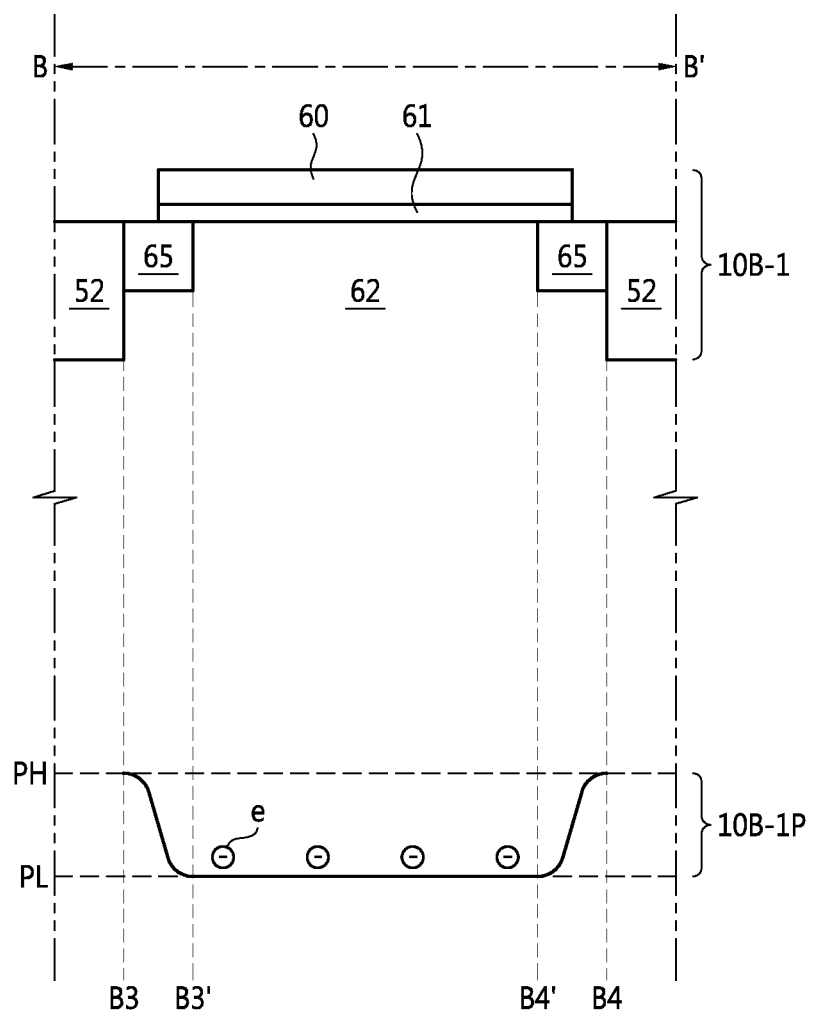
FIG. 7 is a cross-sectional view of a structure of the embodiment of the pixel of FIG. 6, take along line B-B' in FIG. 6, and a diagram of corresponding potential distribution of the pixel, according to the inventive concept.

FIG. 6 is a diagram of a layout 10B of certain elements of other embodiments of a pixel 10B of the pixel array 120 illustrated in FIG. 1 according to the inventive concept. FIG. 7 illustrates a structure 10B-1 of the pixel FIG. 6, as well as a corresponding potential 10B-1P of the structure.

Referring to FIGS. 1, 6 and 7, unlike the pixel having the pixel layout 10A illustrated in FIG. 2, embodiments of a pixel having the pixel layout 10B include STI 52 and a well 62 whose borders B3 and B4 are located laterally outwardly of the supplementary transistor gate 60.

In principle a channel would not be normally be formed when the borders of the active region under the gate, like borders B3 and B4, are located laterally outwardly of the gate. However, in this embodiment, a channel is formed in the active region (well 62) beneath the supplementary transistor gate 60 due to the provision of the channel stop 65.

The potential 10B-1P distributed along line B-B' (the width of the channel) rapidly increases in the region of the channel stop 65 in a direction approaching the STI 52, i.e., between a side B3' of the channel stop 65 and the third border B3 and between a side B4' of the channel stop 65 and the border B4. As seen from the distribution of electrons "e" illustrated in FIG. 7, a channel is actually formed below the supplementary transistor gate 60 between the sides B3' and B4' of the channel stop 65. Therefore, when a channel is formed, the electrons "e" are kept a predetermined distance from the borders B3 and B4, so that a trap effect is suppressed. The channel width is maximal because the borders B3 and B4 are located laterally outwardly of the supplementary transistor gate 60.

Figure 8:
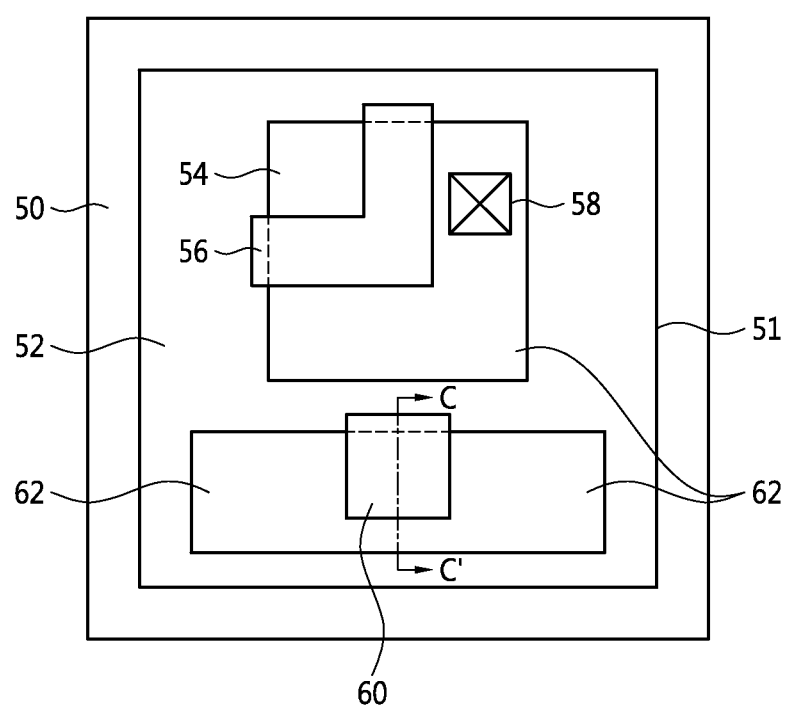
FIG. 8 is a diagram of a layout of another embodiment of a pixel of a pixel array of the system illustrated in FIG. 1 according to the inventive concept.
Figure 9:
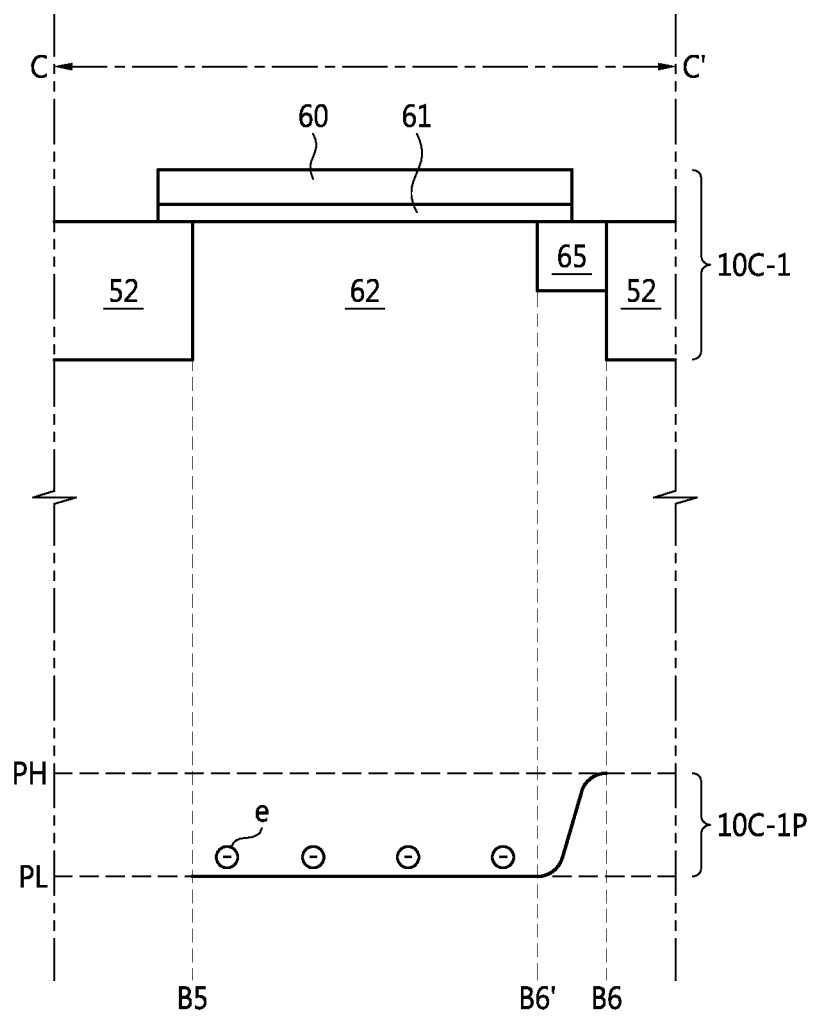
FIG. 9 is a cross-sectional view of a structure of the embodiment of the pixel of FIG. 8, take along line C-C' in FIG. 8, and a diagram of corresponding potential distribution of the pixel, according to the inventive concept.

FIG. 8 is a diagram of a layout of certain elements of other embodiments of a pixel 10C of the pixel array 120 illustrated in FIG. 1 according to the inventive concept. FIG. 9 illustrates a structure 10C-1 of the pixel 10C of FIG. 8, as well as a corresponding potential 10C-1P of the structure.

FIG. 8, like the diagrams before it, shows one pixel 10C of the pixel array of the image sensor of FIG. 1. Unlike the pixel 10A illustrated in FIG. 2, the pixel 10C has one of the borders between the STI 52 and the well 62 located laterally outwardly of the supplementary transistor gate 60. Although FIG. 8 shows an example in which this border between the STI 52 and the well 62 is the one closest to the DTI 50, the inventive concept is not restricted to such an example.

FIG. 9 shows a structure 10C-1 of the pixel 10C, as well as the corresponding potential 10C-1P distributed along the structure. In the structure 10C-1, only one of the borders B6 and B5 of the well 62, namely border B6 in this example, is located laterally outwardly of the supplementary transistor gate 60.

The potential 10C-1P rapidly increases in the region of the channel stop 65 in a direction approaching its border with the STI 52, i.e., in a direction from a side B6' of the channel stop 65 towards the border B6. As seen from the distribution of electrons "e" illustrated in FIG. 9, a channel below the supplementary transistor gate 60 is formed between the border B5 and one side B6' of the channel stop 65. Therefore, when the channel is formed, the electrons "e" are kept a predetermined distance from the border B6, so that a trap effect is suppressed. The structure 10C-1 illustrated in FIG. 9 can produce a relatively wide channel and thus, is more likely to ensure that the pixel has desired operational characteristics.

Figure 10:
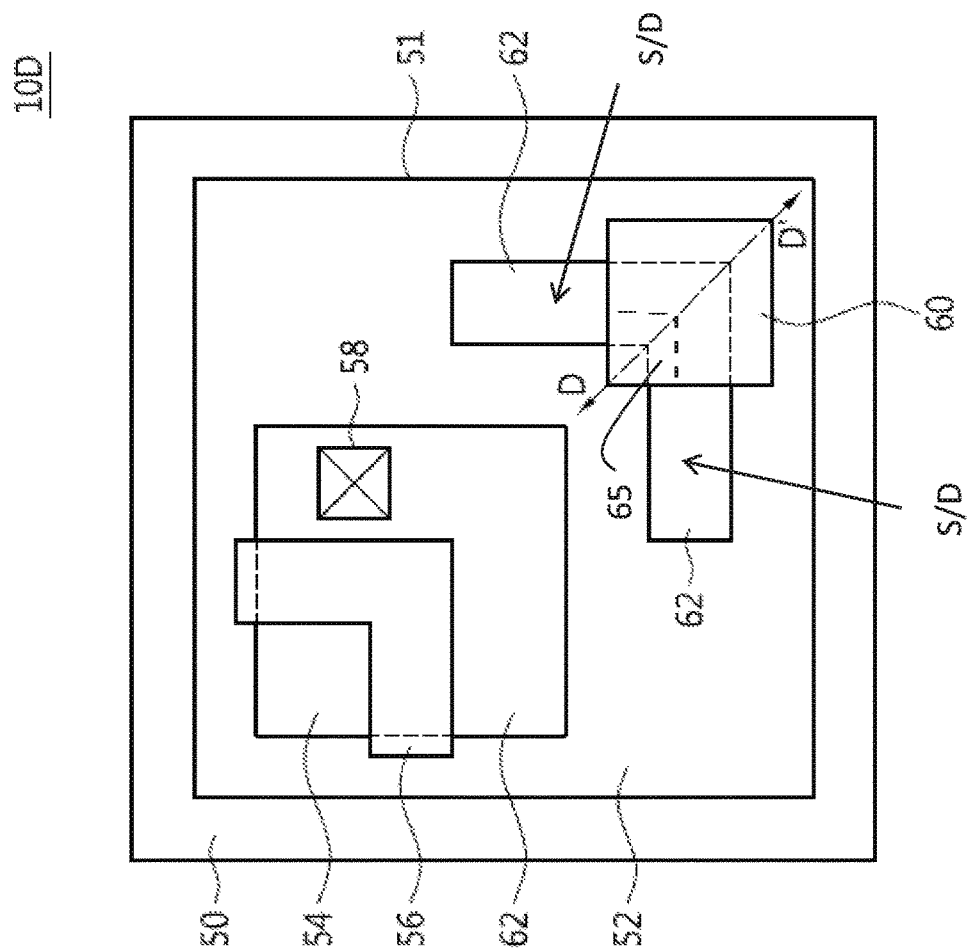
FIG. 10 is a diagram of a layout of another embodiment of a pixel of a pixel array of the system illustrated in FIG. 1 according to the inventive concept.
Figure 11:
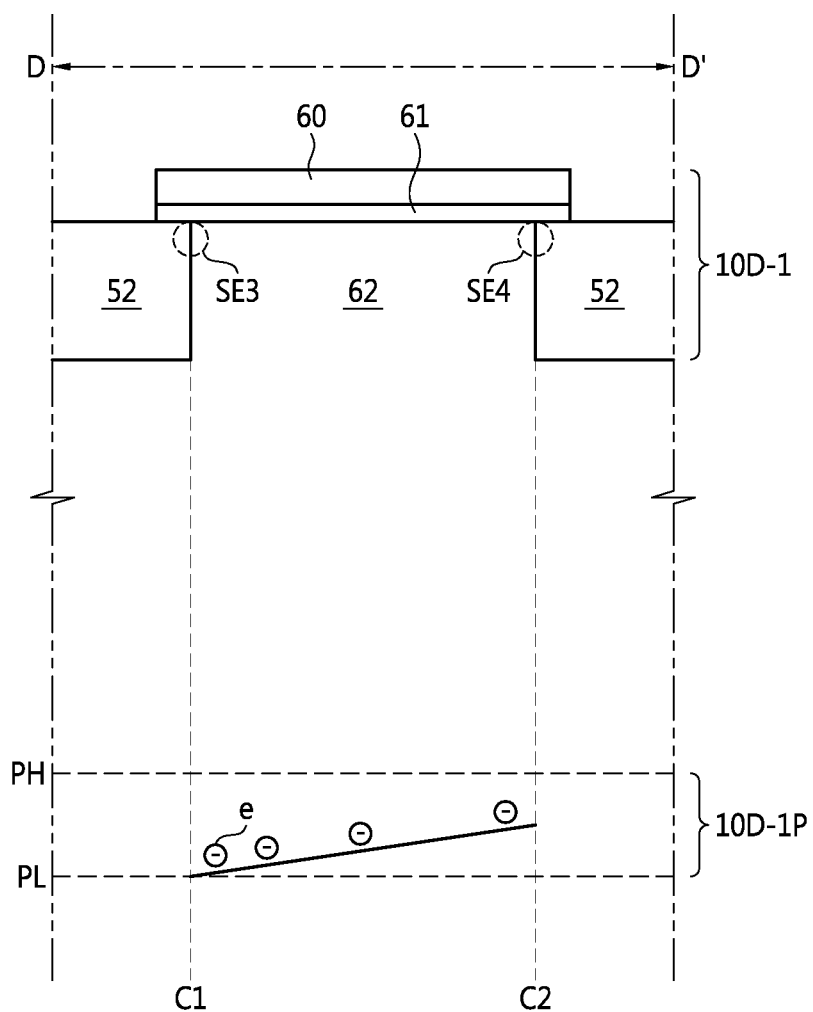
FIG. 11 is a cross-sectional view of a structure of an example of a pixel, take in a direction along a line corresponding to line D-D' in FIG. 10, and a diagram of corresponding potential distribution of the pixel, for use in comparison with an example of a pixel according to the inventive concept.
Figure 12:
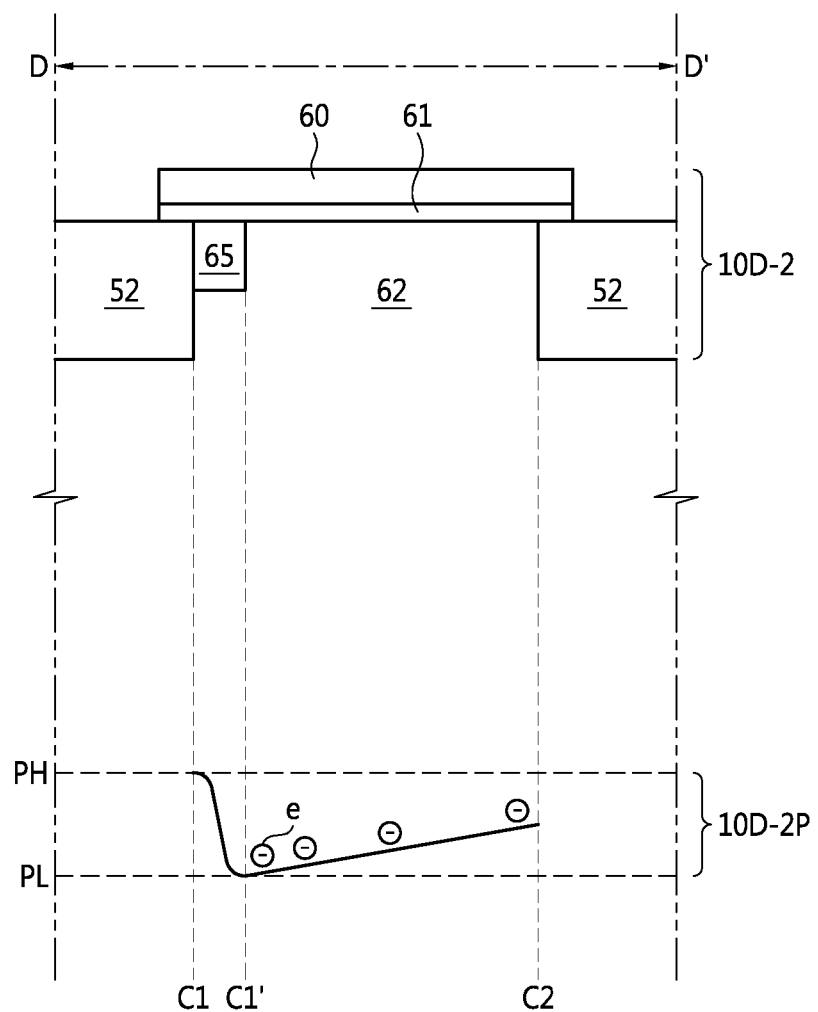
FIG. 12 is a cross-sectional view of a structure of an example of the embodiment of the pixel of FIG. 10, take along line D-D' in FIG. 10, and a diagram of corresponding potential distribution of the pixel, according to the inventive concept.

FIG. 10 is a diagram of a layout of a pixel 10D of the pixel array 120 illustrated in FIG. 1. FIG. 11 is a diagram of a structure 10D-1 and its corresponding potential distribution 10D-1P in an example of a pixel having the layout illustrated in FIG. 10, for use in comparison with this embodiment of a pixel 10D according to the inventive concept, whereas FIG. 12 is a diagram of a structure 10D-2 of the pixel 10D and its corresponding potential distribution 10D-1P according to the inventive concept.

Referring to FIGS. 1, 2 and 10-12, the pixel layout 10D illustrated in FIG. 10 is similar to the pixel 10A of FIG. 2 except that the well 62 pixel layout 10D has a bend in it at the supplementary transistor gate 60. In other words, the supplementary transistor is an angular transistor. The inner and outer corners of the bend in the well 62 may be located laterally inwardly of the supplementary transistor gate 60. In other examples of this embodiment, borders between the well 62 and the STI 52 may have a zigzag shape, i.e., the well may have more than one bend in it. Also, like an example of the pixel 10A of the embodiment of FIG. 2, S/D regions may be provided in the well 62 on opposite sides of the supplementary transistor gate 60. S/D regions may be similarly provided in other examples such as the embodiment of FIG. 13.

The structure 10D-1 illustrated in FIG. 11 is substantially the same as the structure 10A-1 illustrated in FIG. 3. First and second borders between the STI 52 and the well 62 may include a first corner C1 and a second corner C2, respectively. The first corner C1 and the second corner C2 may correspond to the inner corner and the outer corner, respectively, and may be located laterally inwardly of the supplementary transistor gate 60.

In this case, the channel formed adjacent the first corner C1 is relatively short compared to that formed adjacent the second corner C2 although the well 62 has a uniform dopant concentration as between the first and second corners C1 and C2. Therefore, the potential 10D-1P distributed along the width of the channel increases (toward the value of the high potential PH) in a direction from the first corner C1 toward the second corner C2. As a result, there is greater current flow around the first corner C1 than around the second corner C2. As seen from the distribution of electrons "e" illustrated in FIG. 11, a more serious trap effect, causing RTN, may occur at the STI edge SE3 than at the STI edge SE4 as a result.

The structure 10D-2 illustrated in FIG. 12 according to the inventive concept further includes channel stop 65. The channel stop 65 may be formed in the well 62 so as to be adjacent to the first corner C1 and the gate insulator film 61. In other words, the channel stop 65 may be disposed at a position corresponding to the STI edge SE3 where the serious trap effect occurs.

Although FIG. 12 shows only part of the channel stop 65, the channel stop 65 may beneath the inner corner of the supplementary transistor gate 60 along the entire length of the channel region as indicated by the chain lines in FIG. 10, i.e., as extending between the S/D regions. In other examples of this embodiment, the channel stop 65 is also formed at a position corresponding to the STI edge SE4.

The potential 10D-2P rapidly increases in the region of the channel stop 65 in a direction approaching the STI 52, i.e., in a direction from a side C1' of the channel stop 65 towards the first corner C1. As seen from the distribution of electrons "e" illustrated in FIG. 12, a channel is formed beneath the supplementary transistor gate 60 between the side C1' of the channel stop 65 and the second corner C2. Therefore, when the channel is formed, the electrons "e" are kept a predetermined distance from the first corner C1, so that a trap effect is suppressed.

Figure 13:
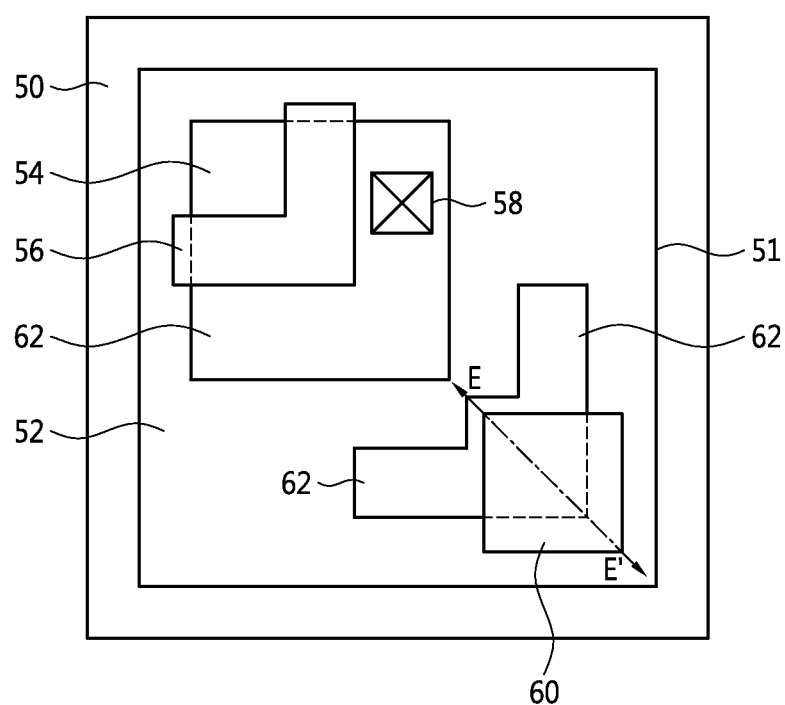
FIG. 13 is a diagram of a layout of another embodiment of a pixel of a pixel array of the system illustrated in FIG. 1 according to the inventive concept.
Figure 14:
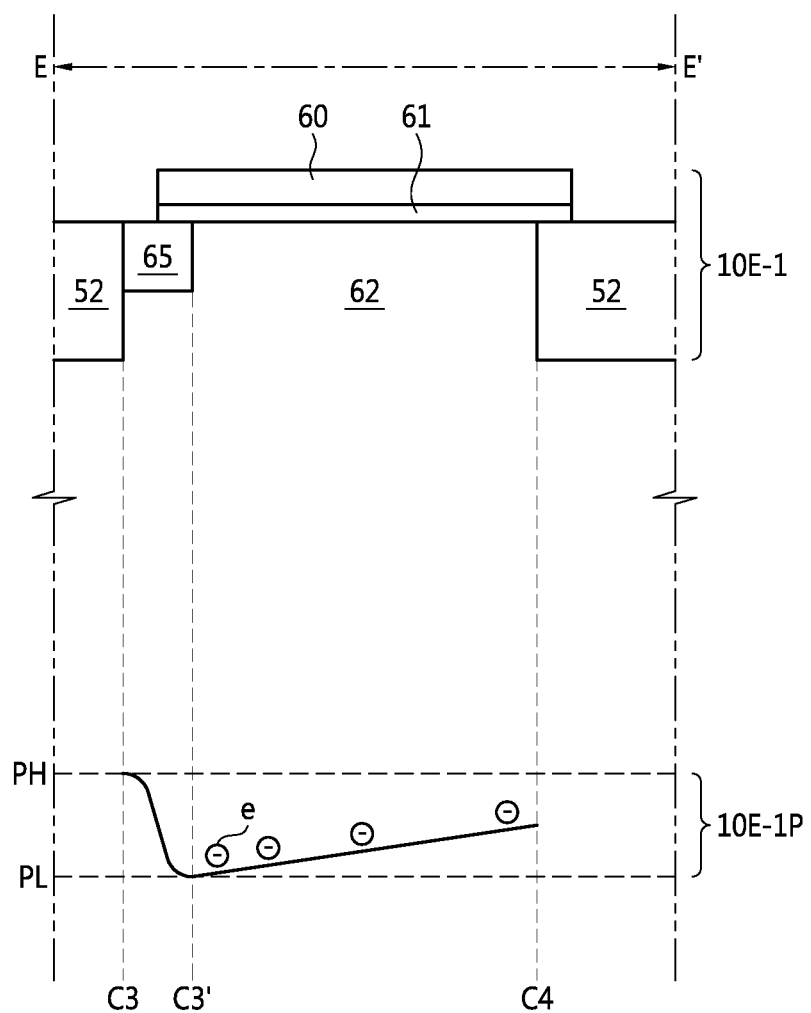
FIG. 14 is a cross-sectional view of a structure of an example of the embodiment of the pixel of FIG. 13, take along line E-E' in FIG. 13, and a diagram of corresponding potential distribution of the pixel, according to the inventive concept.

FIG. 13 is a diagram of a layout of a pixel 10E of the pixel array 120 illustrated in FIG. 1 according to the inventive concept. FIG. 14 is a diagram of a structure 10E-1 of the pixel 10E, as well as a corresponding potential distribution 10E-1P across the structure 10E-1 of the pixel 10E.

Referring to FIGS. 1, 13 and 14, the well 62 of the pixel 10E has a bend in it, like that of the embodiment of FIGS. 11 and 12, and the inner and outer corners of the bend in the well 62 are respectively located laterally outwardly and inwardly of the supplementary transistor gate 60. In another example of this embodiment, the outer corner of the well 62 is also located laterally outwardly of the supplementary transistor gate 60.

FIG. 14 shows corner (first border) C3 and corner C4 (second border) of the well 62 respectively located laterally outwardly and inwardly of the supplementary transistor gate 60. Like the first and second corners C1 and C2, the corners C3 and C4 may be the inner and outer corners of the well 62.

The channel stop 65 may be formed in the well 62 to be adjacent to the corner C3 and the gate insulator film 61. In principle, a channel normally would not be formed if a border, such as corner C3, of a well constituting the channel region were located laterally outwardly of a gate of a transistor disposed on the channel, but a channel can actually be formed in the cannel region beneath the supplementary transistor gate 60 in this embodiment due to the channel stop 65.

The potential 10E-1P rapidly increases in the region of the channel stop 65 in a direction approaching the STI 52, i.e., in a direction from a side C3' of the channel stop 65 to the third corner C3. As seen from the distribution of electrons "e" illustrated in FIG. 14, a channel is formed below the supplementary transistor gate 60 between the side C3' of the channel stop 65 and the fourth corner C4. Therefore, when the channel is formed, the electrons "e" are kept a predetermined distance from the third corner C3, so that a trap effect is suppressed. The potential is high around the fourth corner C4, and therefore, the trap effect hardly occurs. Also, the size of the channel region in which the channel is formed, and therefore, the width of the channel can be maximized despite the presence of the channel stop 65 because the third corner C3 is located laterally outwardly of the supplementary transistor gate 60, in this embodiment.

Figure 15:
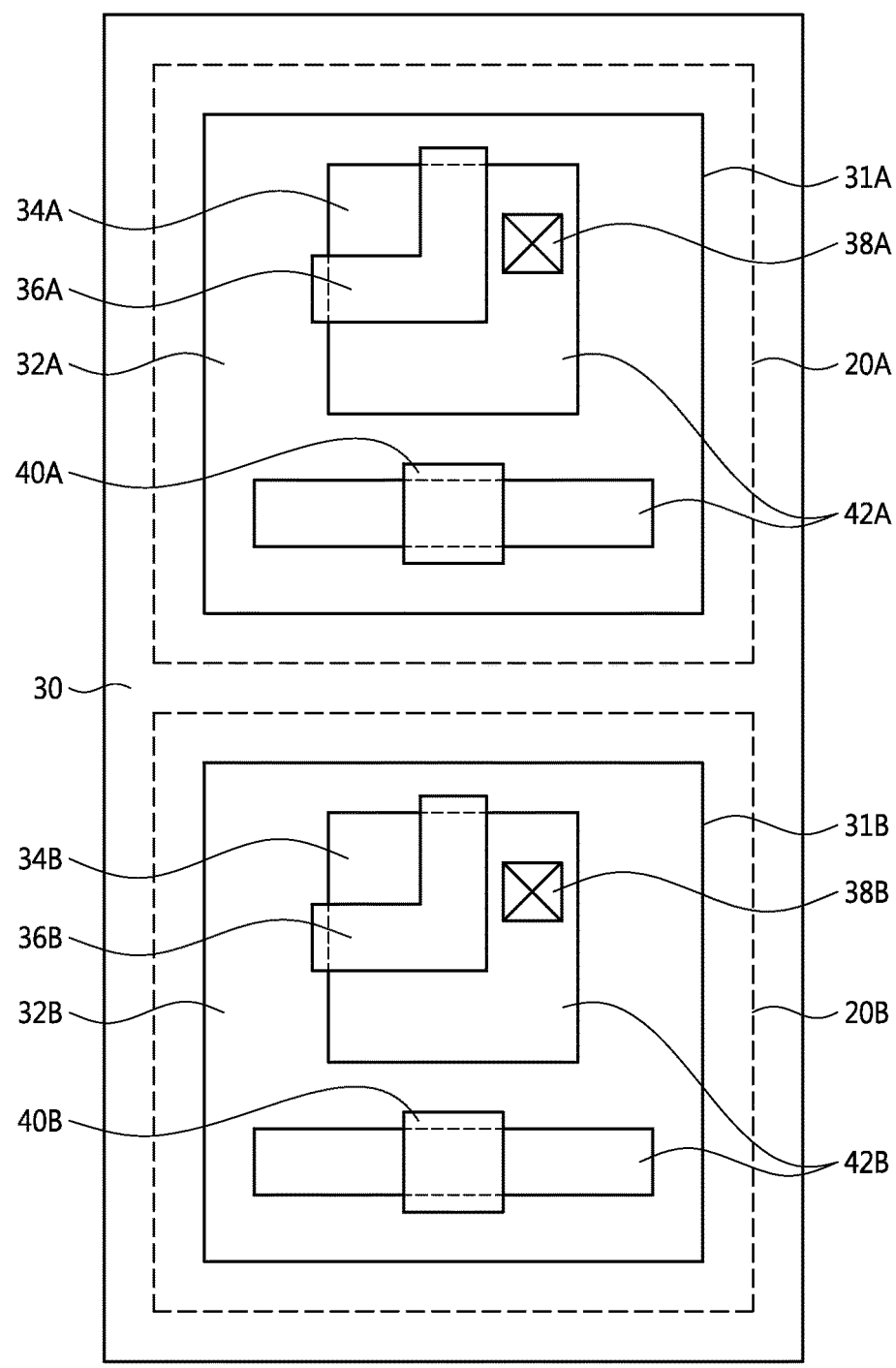
FIG. 15 is a diagram of layout of one embodiment of a group of pixels each having the layout illustrated in FIG. 2 according to the inventive concept.

FIG. 15 is a diagram of a pixel group 20 in which each of the pixels has the layout illustrated in FIG. 2 according to the inventive concept. FIG. 16 is a circuit diagram of the pixel group 20 illustrated in FIG. 15.

Referring to FIGS. 1 through 16, the pixel group 20 may include a first pixel 20A and a second pixel 20B sharing a floating diffusion region FD, and comprising transistors (e.g., RX and SF) configured to generate a signal corresponding to the charges accumulated in the floating diffusion FD.

The first pixel 20A and the second pixel 20B may be disposed adjacent one another but in different rows in a pixel array such as array 120 in FIG. 1. The first pixel 20A and the second pixel 20B may be electrically isolated from each other by a DTI area 30. The DTI area 30 is substantially the same as the DTI area 50 illustrated in FIG. 2.

A first active area 31A in the first pixel 20A and a second active area 31B in the second pixel 20B are each substantially the same as the active area 51 illustrated in FIG. 2. In other words, elements 32A, 34A, 36A, 38A, 40A, and 42A in the first active area 31A and elements 32B, 34B, 36B, 38B, 40B, and 42B in the second active area 31B are substantially the same as the corresponding elements 52, 54, 56, 58, 60, and 62 in the active area 51 illustrated in FIG. 2.

The floating diffusion region FD is made up of region 34A of the first pixel 20A and region 34A of the second pixel 20B, which are connected to each other by a conductive line (not shown) to function as a single node. Each of the pixels 20A and 20B may also include a pixel voltage terminal (not shown) to provide a pixel voltage Vpix illustrated in FIG. 16. The pixel voltage Vpix may be a power supply voltage VDD, but the inventive concept is not restricted to such a feature.

Figure 16:
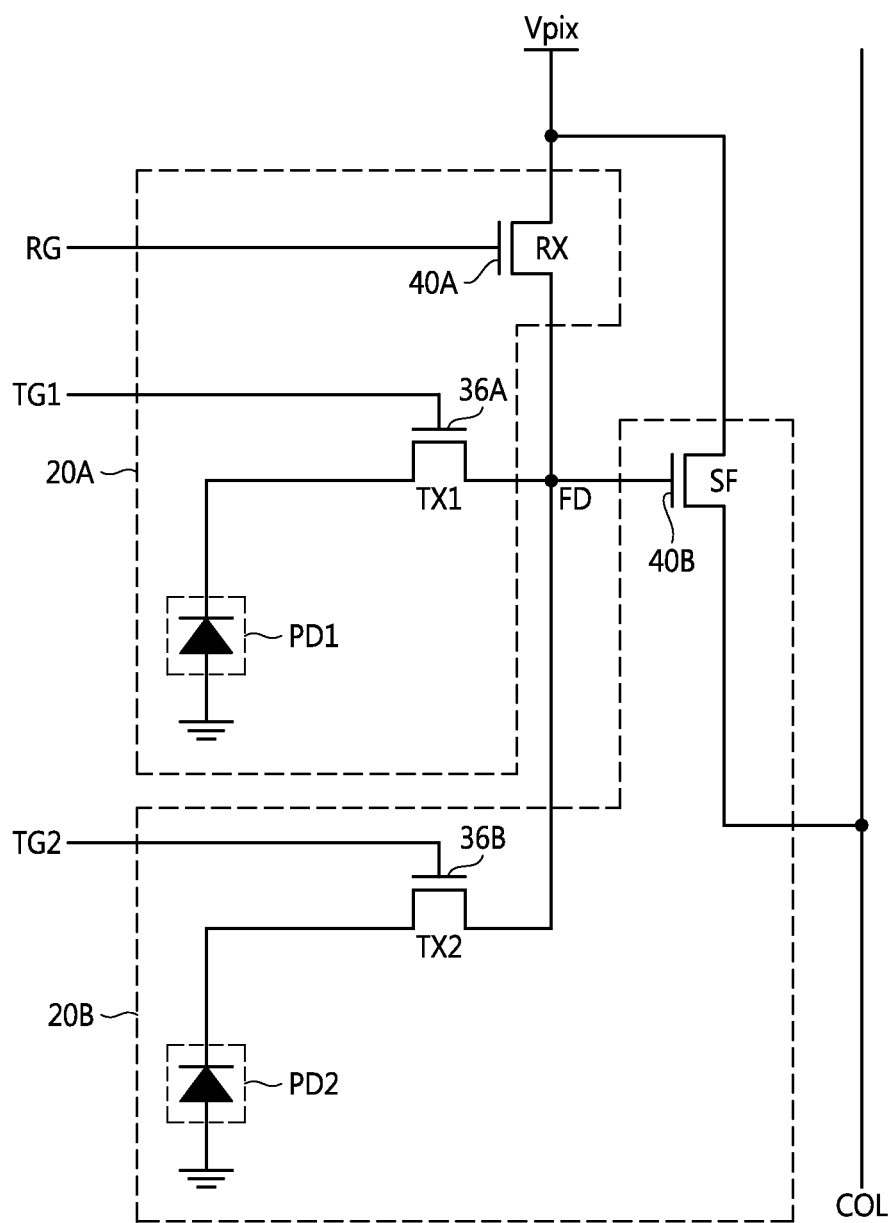
FIG. 16 is a circuit diagram of the pixel group illustrated in FIG. 15.

In the pixel group 20 illustrated in its circuit diagram of in FIG. 16, the first pixel 20A includes a first photo diode PD1, a first transfer transistor TX1, and a reset transistor RX. The second pixel 20B includes a second photo diode PD2, a second transfer transistor TX2, and a source follower SF.

A gate of the first transfer transistor TX1, a gate of the reset transistor RX, a gate of the second transfer transistor TX2, a gate of the source follower SF, and the floating diffusion region FD respectively correspond to the transfer transistor gate 36A, the supplementary transistor gate 40A, the transfer transistor gate 36B, the supplementary transistor gate 40B, and the regions 34A, 34B. In other words, the supplementary transistor of the first pixel 20A serves as the reset transistor RX and the supplementary transistor of the second pixel 20B serves as the source follower SF.

The first and second photo diodes PD1 and PD2 may comprise n-type or p-type regions formed in a semiconductor substrate by ion implantation. Each of the first and second photo diodes PD1 and PD2 is a photo electric conversion element that accumulates photocharges generated according to the intensity of incident light. Each of the first and second photo diodes PD1 and PD2 may be a photo transistor, a pinned photo diode, or a combination thereof.

The first and second photo diodes PD1 and PD2 may be formed below the first active area 31A and the second active area 31B, respectively, across most of the first active area 31A and the second active area 31B to obtain a high fill factor. Fill factor is the ratio of a light receiving area to a pixel area. The higher the fill factor, the higher the light absorption.

The first transfer transistor TX1 may transfer photocharges accumulated at the first photo diode PD1 to the floating diffusion region FD in response to a transfer control signal TG1 input to the gate 36A. The second transfer transistor TX2 may transfer photocharges accumulated at the second photo diode PD2 to the floating diffusion region FD in response to a transfer control signal TG2 input to the gate 36B.

The reset transistor RX may reset the floating diffusion region FD to the pixel voltage Vpix in response to a reset control signal RG input to the gate 40A. The source follower SF may generate a current corresponding to a voltage level of the floating diffusion region FD connected to the gate 40B and may output the current as one of the pixel signals P1 through Pm to a column line COL.

The transfer control signals TG1 and TG2 and the reset control signal RG may be controlled so that a resetting of the floating diffusion region FD, a readout of photocharges accumulated at the first photo diode PD1, a resetting of the floating diffusion region FD, and a readout of photocharges accumulated at the second photo diode PD2 are sequentially performed. Other operations of the pixel group 20 are substantially the same as those of a conventional 3-transistor (3T) pixel. Thus, detailed descriptions thereof will be omitted.

Figure 17:
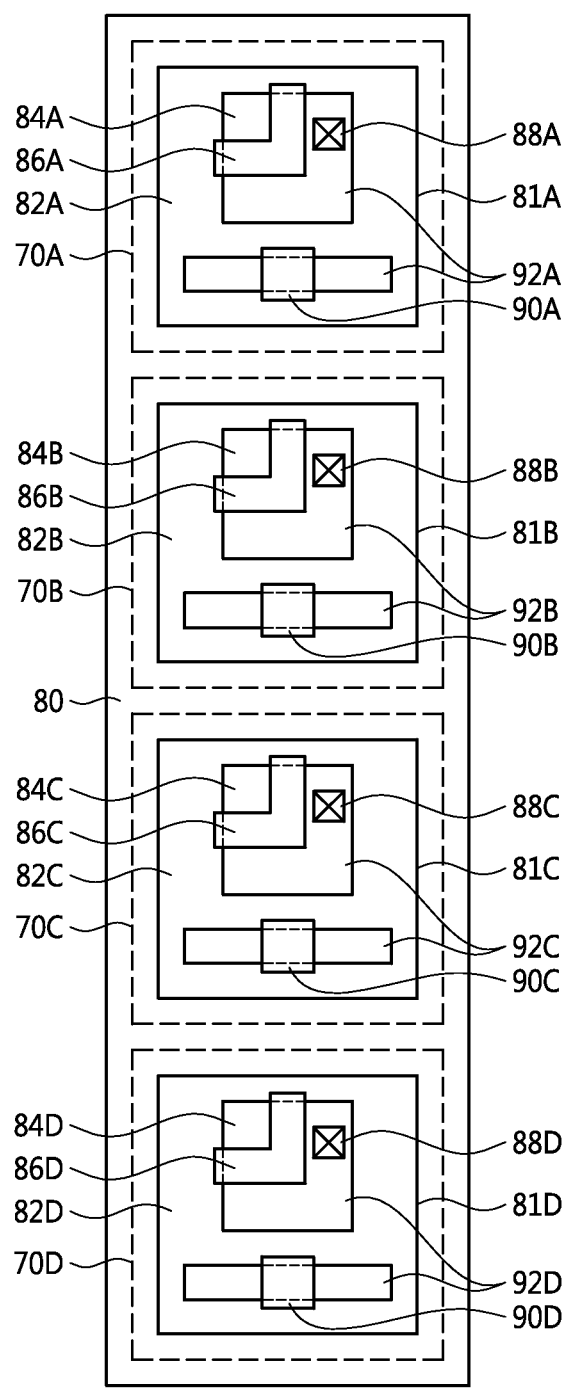
FIG. 17 is a diagram of another embodiment of a group of pixels each having the layout illustrated in FIG. 2 according to the inventive concept.

FIG. 17 is a diagram of a pixel group 70 of pixels each of which has the layout illustrated in FIG. 2 according to the inventive concept. FIG. 18 is a circuit diagram of the pixel group 70 illustrated in FIG. 17.

The pixel group 70 may include first through fourth pixels 70A, 70B, 70C, and 70D. The pixel group 70 is substantially the same as the pixel group 20 illustrated in FIGS. 15 and 16 except for differences which will be described below.

Referring to FIGS. 1, 2, 17 and 18, the first through fourth pixels 70A through 70D may be adjacent to each other but in different rows in the pixel array 120. The first through fourth pixels 70A through 70D may be electrically isolated from one another by a DTI area 80. The DTI area 80 is substantially the same as the DTI area 50 illustrated in FIG. 2.

Active areas 81A, 81B, 81C, and 81D in the respective first through fourth pixels 70A through 70D are each substantially the same as the active area 51 illustrated in FIG. 2. In other words, elements, for example, 82A, 84A, 86A, 88A, 90A, and 92A in each of the active areas 81A through 81D are substantially the same as the corresponding elements 52, 54, 56, 58, 60, and 62 in the active area 51 illustrated in FIG. 2. A floating diffusion region FD is provided by connecting regions 84A, 84B, 84C, and 84D of the respective first through fourth pixels 70A through 70D to one another with a conductive line (not shown) so that the regions function as a single node.

Figure 18:
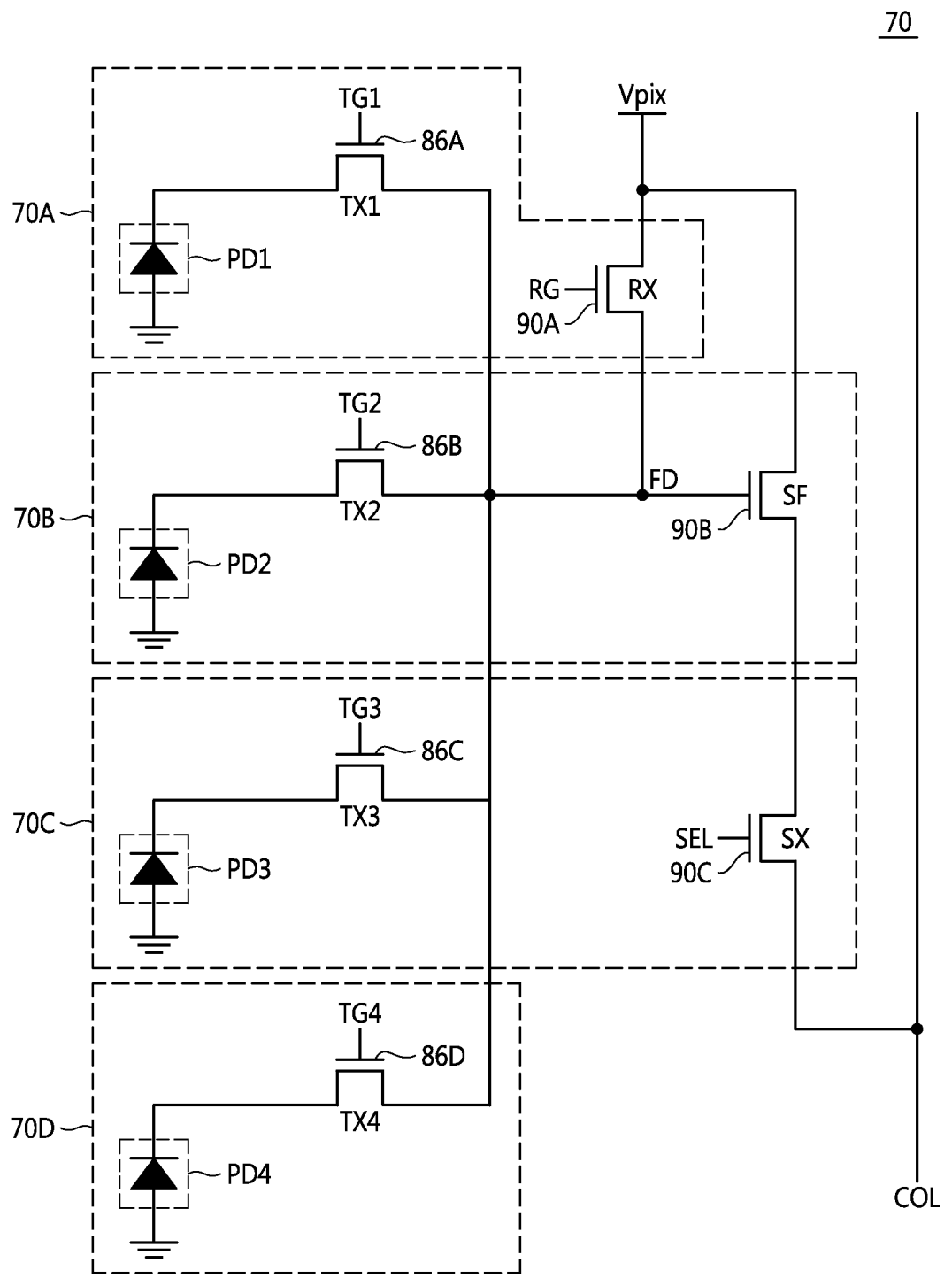
FIG. 18 is a circuit diagram of the pixel group illustrated in FIG. 17.

In the circuit diagram of the pixel group 70 illustrated in FIG. 18, the first pixel 70A includes first photo diode PD1, first transfer transistor TX1, and reset transistor RX. The second pixel 70B includes second photo diode PD2, second transfer transistor TX2, and source follower SF. The third pixel 70C includes a third photo diode PD3, a third transfer transistor TX3, and a select transistor SX. The fourth pixel 70D includes a fourth photo diode PD4 and a fourth transfer transistor TX4.

A gate of the first transfer transistor TX1, a gate of the reset transistor RX, a gate of the second transfer transistor TX2, a gate of the source follower SF, a gate of the third transfer transistor TX3, a gate of the select transistor SX, a gate of the fourth transfer transistor TX4, and the floating diffusion FD respectively correspond to the transfer transistor gate 86A, the supplementary transistor gate 90A, a transfer transistor gate 86B, a supplementary transistor gate 90B, a transfer transistor gate 86C, a supplementary transistor gate 90C, a transfer transistor gate 86D, and the collection of regions 84A, 84B, 84C and 84D. In other words, a supplementary transistor of the first pixel 70A serves as the reset transistor RX, a supplementary transistor of the second pixel 70B serves as the source follower SF, a supplementary transistor of the third pixel 70C serves as the select transistor SX, and a supplementary transistor of the fourth pixel 70D serves as a dummy transistor in which all gate, source and drain terminals are connected to the ground so that it does not contribute to the operation of the circuit.

The operations of the first through fourth photo diodes PD1 through PD4, the first through fourth transfer transistors TX1 through TX4, the reset transistor RX, and the source follower SF are substantially the same as the operations of the first and second photo diodes PD1 and PD2, the first and second transfer transistors TX1 and TX2, the reset transistor RX, and the source follower SF illustrated in FIG. 16. The select transistor SX may output, as one of the pixel signals P1 through Pm, a current generated by the source follower SF to a column line COL in response to a selection control signal SEL.

Transfer control signals TG1, TG2, TG3, and TG4, the reset control signal RG, and the selection control signal SEL may be controlled so that a resetting of the floating diffusion region FD and readout of photocharges accumulated at a respective one of the first through fourth photo diodes PD1 through PD4 are alternately and sequentially performed. Other operations of the pixel group 70 are substantially the same as those of a conventional 4-transistor (4T) pixel. Thus, detailed descriptions thereof will be omitted.

The embodiments of pixel groups illustrated in FIGS. 15 through 18 have been described as being made up of pixels each having the layout 10A illustrated in FIG. 2, but the inventive concept is not restricted to these embodiments. The pixel groups may comprise any of the other pixels 10B through 10E.

A decrease in RTN by the channel stop 65, which has been described with reference to FIGS. 2 through 14, is most crucial in a source follower SF. This is because the source follower SF is most sensitive to noise considering that there is a high possibility of a trap effect occurring in the source follower SF because the number of charges transferred by the source follower SF is relatively great compared to the number of charges transferred by the transfer transistors TX1 through TX4 or the reset transistor RX.

Figure 19:
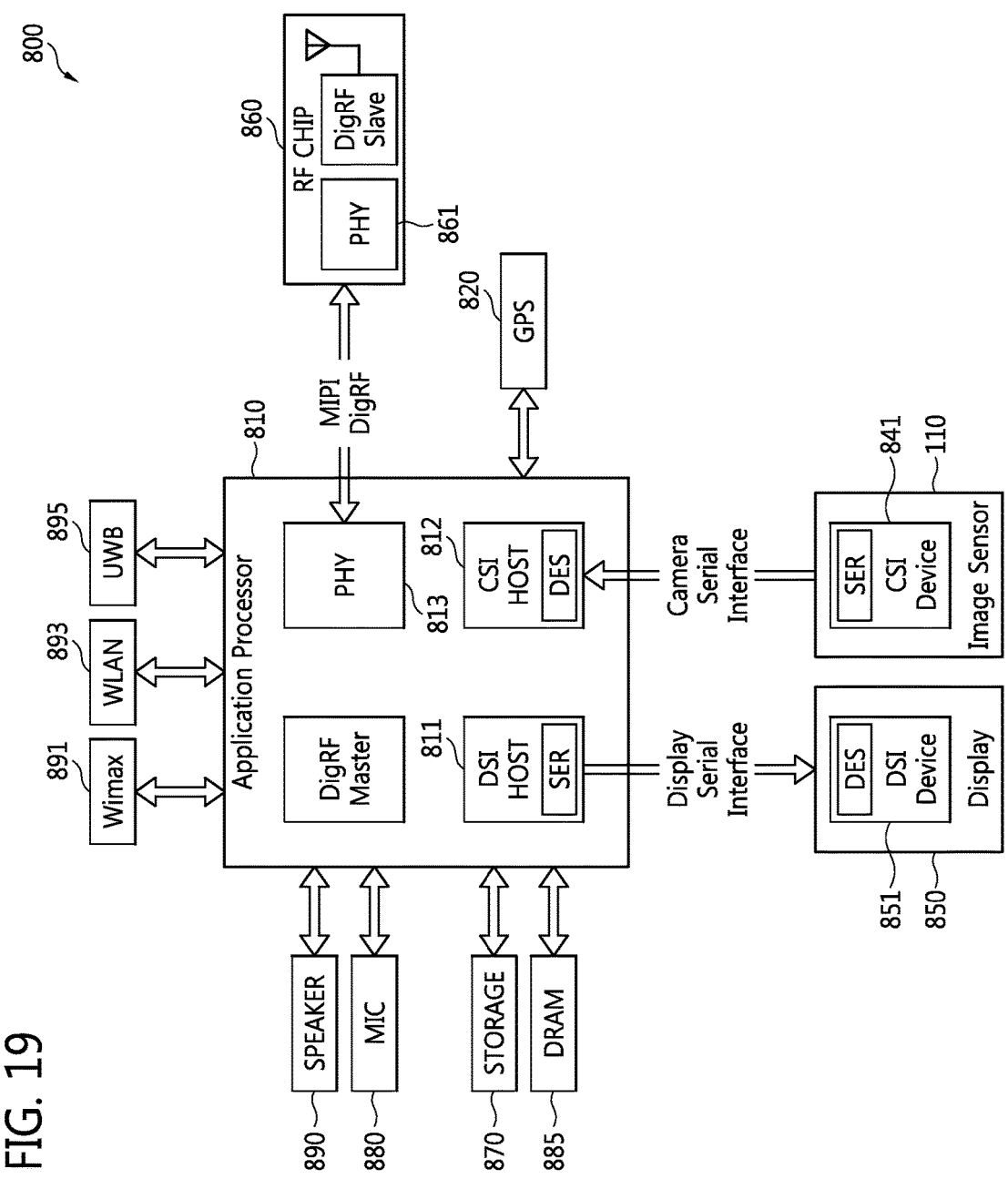
FIG. 19 is a block diagram of an electronic system including an image sensor, according to the inventive concept.

FIG. 19 is a block diagram of an electronic system including an image sensor according to the inventive concept. Referring to FIGS. 1 and 19, the electronic system 800 may be that employed by any device that processes data and captures images, such as a mobile phone, a personal digital assistant (PDA), a portable media player (PMP), an IP TV, or a smart phone that can use or support the MIPI interface. The electronic system 800 includes an image sensor 110, an application processor 810 and a display 850.

A camera serial interface (CSI) host 812 of the application processor 810 performs serial communication with a CSI device 841 of the image sensor 110 through CSI. For example, an optical de-serializer (DES) may be incorporated in the CSI host 812, and an optical serializer (SER) may be incorporated in the CSI device 841.

A display serial interface (DSI) host 811 of the application processor 810 performs serial communication with a DSI device 851 of the display 850 through DSI. For example, an optical serializer may be incorporated in the DSI host 811, and an optical de-serializer may be incorporated in the DSI device 851.

The electronic system 800 may also include a radio frequency (RF) chip 860 which communicates with the application processor 810. A physical layer (PHY) 813 of the electronic system 800 and a PHY of the RF chip 860 communicate with each other according to a MIPI DigRF standard. The electronic system 800 may further include at least one element among a GPS 820, a storage device 870, a microphone 880, a DRAM 885 and a speaker 890. The electronic system 800 may communicate using Wimax (World Interoperability for Microwave Access) 891, WLAN (Wireless LAN) 893 and/or UWB (Ultra Wideband) 895.

Figure 20:
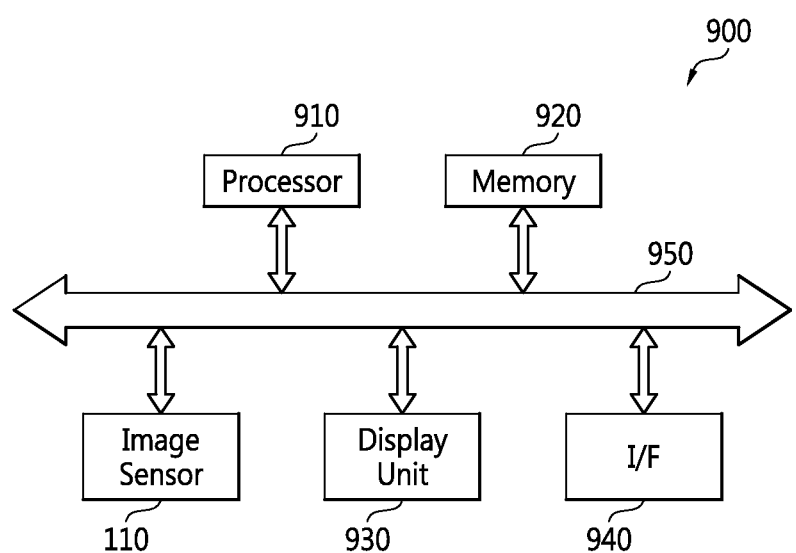
FIG. 20 is a block diagram of an electronic system including the image sensor of FIG. 19, according to the inventive concept.

FIG. 20 is a block diagram of an electronic system 900 including an image sensor according to the inventive concept. Referring to FIGS. 1 and 20, the electronic system 900 may include the image sensor 110, a processor 910, a memory 920, a display unit 930, and an interface (I/F) 940.

The processor 910 may control the operation of the image sensor 110. For example, the processor 910 may process pixel signals output from the image sensor 110 and generate image data.

The memory 920 may store a program (code) for controlling the image sensor 110 and the image data generated by the processor 910. The processor 910 may execute the program stored in the memory 920. The memory 920 may be a non-volatile memory.

The display unit 930 may display the image data output from the processor 910 or the memory 920. For example, the display unit 930 may be a liquid crystal display (LCD), a light emitting diode (LED) display, an organic LED (OLED) display, an active matrix organic light emitting diodes (AMOLED) display or a flexible display.

The interface 940 may be configured to input and output the image data. For example, the interface 940 may be a wireless interface.

As described above, the inventive concept suppresses a trap effect at an STI edge in a pixel, thereby minimizing noise caused by the trap effect.

The present inventive concept can also, in general, be embodied along with a computer-readable medium, i.e., any data storage device that can store data as a program which can be thereafter read by a computer system. Examples of a computer-readable medium include read-only memory (ROM), random-access memory (RAM), CD-ROMs, magnetic tapes, floppy disks, and optical data storage devices.

The computer-readable recording medium can also be distributed over network coupled computer systems so that computer-readable code is stored and executed in a distributed fashion.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A pixel comprising:
a well containing dopant at a first concentration;
a gate of a transistor disposed on the well;
shallow trench isolation (STI) electrically isolating the well, whereby the STI has first and second sides defining first and second borders, respectively, of a channel region of the pixel comprising the well and through which a channel of the transistor is formed, the first and second borders being spaced in a first direction corresponding to the widthwise direction of the channel; and
a channel stop adjoining the STI along an upper edge of each of at least one of the first and second borders facing the channel region of the pixel through which the channel of the transistor is formed, the channel stop containing dopant at a second concentration higher than the first concentration,
wherein the gate has opposite outer peripheral portions spaced from one another in the first direction,
the gate extends over at least part of the channel stop in the first direction,
each of the opposite outer peripheral portions of the gate extends over the channel stop or a portion of the STI laterally outwardly of the well,
the first border defined by the first side of the STI is located laterally outwardly of the gate,
the second border defined by the second side of the STI is located laterally inwardly of the gate so as to lie beneath the gate,
the channel stop is adjacent to the first border defined by the first side of the STI,
the channel region of the pixel covers the second side of the STI, and
the channel stop adjoining the STI contacts the well.

2. The pixel of claim 1, wherein the well has a bend in it beneath the gate, the first and second borders between the well and the STI include a first corner of the bend, the first corner is located laterally outwardly of the gate, and the channel stop is adjacent to the first corner.

3. The pixel of claim 1, wherein the gate is a gate of a source follower.

4. A pixel comprising:
a well containing dopant at a first concentration;
a gate of a transistor disposed on the well;
shallow trench isolation (STI) electrically isolating the well, whereby the STI has first and second sides defining first and second borders, respectively, of a channel region of the pixel comprising the well and through which a channel of the transistor is formed, the first and second borders being spaced in the widthwise direction of the channel; and
a channel stop adjacent at least one of the first and second borders and containing dopant at a second concentration higher than the first concentration,
wherein the first border defined by the first side of the STI is located laterally outwardly of the gate, the second border defined by the second side of the STI is located laterally inwardly of the gate so as to lie beneath the gate, the channel stop is adjacent to the first border defined by the first side of the STI, and the channel region covers the second side of the STI.

5. An image sensor comprising a pixel array having a plurality of pixels at least one of which is a pixel as claimed in claim 4, and each of which is configured to output a pixel signal corresponding to incident light;
a readout circuit configured to perform analog-to-digital conversion on the pixel signal and to generate a digital pixel signal; and
a timing generator configured to control the pixel array and the readout circuit.

6. The image sensor of claim 5, wherein the pixel array comprises floating diffusion regions, and each of the pixels shares a respective one of the floating diffusion regions with at least one pixel adjacent thereto in the array.

7. A pixel comprising:
a well containing dopant at a first concentration;
a gate of a transistor disposed on the well;
shallow trench isolation (STI) electrically isolating the well, whereby the STI has first and second sides defining first and second borders, respectively, of a region of the pixel comprising the well and through which a channel of the transistor is formed, the first and second borders being spaced in the widthwise direction of the channel; and a channel stop adjacent at least one of the first and second borders and containing dopant at a second concentration higher than the first concentration, wherein the well has a bend in it beneath the gate, the first and second borders between the well and the STI include a first corner of the bend, the first corner is located laterally outwardly of the gate, and the channel stop is adjacent to the first corner.

8. An image sensor comprising a pixel array having a plurality of pixels at least one of which is a pixel as claimed in claim 7, and each of which is configured to output a pixel signal corresponding to incident light;

a readout circuit configured to perform analog-to-digital conversion on the pixel signal and to generate a digital pixel signal; and a timing generator configured to control the pixel array and the readout circuit.

9. The image sensor of claim 8, wherein the pixel array comprises floating diffusion regions, and each of the pixels shares a respective one of the floating diffusion regions with at least one pixel adjacent thereto in the array.

* * * * *